United States Patent [19]

Eshbaugh

[11] Patent Number: 4,675,548
[45] Date of Patent: Jun. 23, 1987

[54] ANTISATURATION CIRCUIT FOR TTL CIRCUITS HAVING TTL INPUT AND OUTPUT COMPATIBILITY

[75] Inventor: Kevin S. Eshbaugh, Palm Bay, Fla.

[73] Assignee: Harris Corporation, Melbourne, Fla.

[21] Appl. No.: 670,103

[22] Filed: Nov. 13, 1984

[51] Int. Cl.$^4$ .................... H03K 17/04; H03K 5/08
[52] U.S. Cl. .................... 307/300; 307/280; 307/567; 307/310; 307/443
[58] Field of Search .............. 307/280, 300, 549, 567, 307/560, 562, 456, 443, 310

[56] References Cited

U.S. PATENT DOCUMENTS

| 3,160,765 | 10/1962 | Krossa | 307/300 |
| 3,676,713 | 7/1972 | Wiedmann | 307/300 |
| 4,109,166 | 8/1978 | Clark, Jr. et al. | 307/300 |

OTHER PUBLICATIONS

"Analysis and Design of Digital Integrated Circuits", by David Hodges and Horace Jackson, 1983, McGraw Hill, pp. 255-261.

Primary Examiner—John S. Heyman
Assistant Examiner—Richard Roseen
Attorney, Agent, or Firm—William A. Troner; Thomas N. Twomey; Chuck C. Krawczyk

[57] ABSTRACT

A transistor-transistor logic gate circuit arrangement for saturation control while providing TTL input and output compatibility. The circuit comprises a resistor divider network coupled across the base emitter junction of a phase splitter transistor. A preselected fraction of the phase splitter's $V_{BE}$ is produced at the base of an antisaturation transistor. The antisaturation transistor is coupled across the collector-base of an output transistor thereby providing a method of clamping an output transistor using $V_{BE}$ as a reference voltage. Because $V_{BE}$ is used as the reference, the circuit can maintain TTL output voltage levels while preventing the output transistor from saturating in an extremely wide range of operating temperatures.

4 Claims, 1 Drawing Figure

ANTISATURATION CIRCUIT FOR TTL CIRCUITS HAVING TTL INPUT AND OUTPUT COMPATIBILITY

BACKGROUND OF THE INVENTION

This invention relates to transistor-transistor logic (TTL) circuits and more particularly to the prevention of transistor saturation in TTL circuits while maintaining standard TTL input and output voltage levels over a wide range of temperature.

TTL circuits are widely used because of their logic flexibility, low power dissipation and fast switching capability. These circuits, however, encounter problems when operated over a wide range of temperatures because of the dependence of P-N junction characteristics on temperature variations In order to achieve the fast turn on transition desired in TTL circuits, high drive currents are generally used for driving the circuit's output transistor. These high currents, however, also drive the transistor into deep saturation which results in excess charge build-up in the driven transistor. This excess charge build-up results in a longer turn-off delay because of the time it takes for the built up charge to dissipate. It is this long turn-off delay which has prevented the use of TTL circuits in many high speed applications, particularly in high temperature environments where saturation is attained as a result of an increase in minority carriers. On the other hand, when a TTL circuit is operated at low temperatures, saturation of the output transistor is not a concern due to the reduction of minority carriers which are present at low temperatures. Instead, maintaining the low level output voltage ($V_{OL}$) within the standard TTL level of approximately 0.4 v becomes a problem. As the temperature decreases, the offset voltage of the transistor increases. At very low temperatures, this can be significant enough to cause the $V_{OL}$ to increase above the standard level of 0.4 v. Thus, if a TTL circuit is to operate at fast switching speeds and within TTL output specifications, a means must be included in the circuit which will prevent the output transistor from saturating at high temperatures while providing a reference voltage for the output such that $V_{OL}$ falls within TTL specifications at low temperatures.

Several methods have been implemented for preventing saturation of the output transistor even at high temperatures, although the prior art does not address the problem of also keeping within the $V_{OL}$ specifications at low temperatures. A common antisaturation technique uses a Schottky diode in shunt with the base collector junction of a common emitter NPN output transistor. Because the Schottky diode has a lower forward voltage ($V_F$) than the forward biased voltage of the shunted junction ($V_{BC}$), the Schottky diode clamps the junction voltage to a level lower than the collector-base forward biased voltage, thereby preventing saturation of the output transistor. The problem with using Schottky diodes is that both the forward voltage of the Schottky diode and the forward biased voltage of the P-N junctions of the output transistor vary as a function of temperature, approximately $-1$ mV/°C. and $-2$ mV/°C. respectively. As the temperature increases, the relative difference betweeen $V_F$ and $V_{BC}$ decreases. This results in the Schottky clamp losing its effectiveness at preventing saturation of the output transistor at high temperatures.

Even in this arrangement, during low temperature operation the $V_{OL}$ still remains a potential problem. Although the difference between the levels of $V_F$ and $V_{BC}$ increases as temperature drops, thereby assuring effective clamping against saturation, a drop in temperature produces an increased offset voltage of the clamped transistor which can cause $V_{OL}$ to exceed the standard TTL output voltage level. Thus, the use of Schottky diodes is not effective as an antisaturation device when the circuit is to be operated at high and low temperatures.

A different approach in preventing saturation which does not rely on the use of Schottky devices is taught in Wiedmann, U.S. Pat. No. 3,676,713, whereby by an NPN transistor is used instead of a Schottky diode to shunt the collector-base voltage of the output transistor. The clamping technique of Wiedmann does not allow for the use of standard TTL input voltage levels in the circuit. Instead of utilizing the 0.8 v to 2.0 v, input threshold levels of TTL, the Wiedmann circuit requires an input of less than 0.8 v. Thus, Wiedmann's circuit can not be utilized in standard TTL circuitry.

Additionally, Wiedmann uses a collector-base junction voltage as a reference voltage for the antisaturation circuit. Typically in NPN transistors, the collector is doped less than the emitter thereby producing a larger parasitic resistance in series with the collector-base junction as opposed to the base-emitter junction. By using the collector-base junction as a reference voltage, the range with which the reference voltage will linearly correspond with the collector current will be small. As the collector current increase through the junction, the parasitic resistance of the junction becomes more prominent. Thus, at high collector currents a small change in the current results in a relatively large change in the reference voltage for the antisaturation circuit.

SUMMARY OF THE INVENTION

It is therefore an object of the present invention to provide a TTL circuit for preventing saturation of transistors while providing for standard TTL input and output voltage levels.

It is a further object of the present invention to provide a TTL circuit for preventing saturation of transistors while still maintaining TTL level output voltages when the circuit is operating at low ambient temperatures.

It is another object of the present invention to provide a TTL circuit for preventing saturation of transistors at very high ambient temperatures thereby retaining high switching speeds.

A further object of the present invention is to provide a TTL circuit for preventing saturation of an output transistor, using a reliable internal reference voltage for biasing the antisaturation circuit.

In accordance with the above objects, a voltage control means is provided to permit the selection of an internal reference potential which is dependent upon the junction voltage across a single junction of a semiconductor element. More specifically, a resistor divider network is coupled across the base emitter junction of a phase splitter transistor such that it provides a reliable reference source for an antisaturation transistor. The resistance values of the divider network which comprises two resistors, are approximately of equal value so that one half of the phase splitter's base emitter voltage drops across each resistor. This allows the base potential of the antisaturation transistor to be 1.5 $V_{BE}$ with respect to ground potential. Since its base is at this potential, the antisaturation transistor which is coupled across the collector-base junction of the output transistor will conduct when the output voltage $V_{OL}$ of the circuit drops down to 0.5 $V_{BE}$. Thus both the clamping voltage across the collector-base of the output transistor and the low level output voltage are equal to 0.5 $V_{BE}$.

Although the base emitter forward biased voltages generally increase as the ambient temperature decreases, it has been discovered that providing a $V_{OL}$ of approximately a half $V_{BE}$ will allow $V_{OL}$ to meet the TTL output specifications even when the TTL circuit is operating at temperatures as low as −55° C. As the ambient temperature increases causing the base emitter junction voltage to decrease, having a half $V_{BE}$ across the collector-base junction of the output transistor will prevent the output from saturating, even at temperatures as high as 125° C. Thus, using the base emitter voltage as an internal reference for biasing an antisaturation circuit provides an effective means for preventing saturation and providing TTL output levels over an extremely wide range of temperatures.

This circuit can also be easily extended to include an additional $V_{BE}$ drop in the input stage so that the input to the circuit is TTL compatible as well. By including a Baker Clamp across the phase splitter's collector-base junction, the phase splitter is prevented from going into saturation and the additional $V_{BE}$ drop is provided. Other methods of clamping the phase splitter and providing a $V_{BE}$ drop may be utilized without effecting the reliability of the technique of the invention.

An active pull up stage to the output should also be included for TTL fast switching operations in that it provides a low impedance to the output for charging up the load capacitance. In this way, the pull up stage will help to quickly bring the output voltage to a high level when the TTL input goes to a low level. A Darlington pair pull up would conveniently provide this capability although other pull up stages might be conveniently adopted. In this arrangement it can be seen how the output transistor is protected by the antisaturation transistor and how the antisaturation transistor is controlled by the internal reference voltage which is provided by the resistive divider network to which is supplied the base emitter voltage of the phase splitter transistor.

BRIEF DESCRIPTION OF THE DRAWING

The FIGURE shows a circuit schematic of the preferred embodiment of a high speed TTL circuit in accordance with the invention.

DETAILED DESCRIPTION OF THE INVENTION

Figure 1:
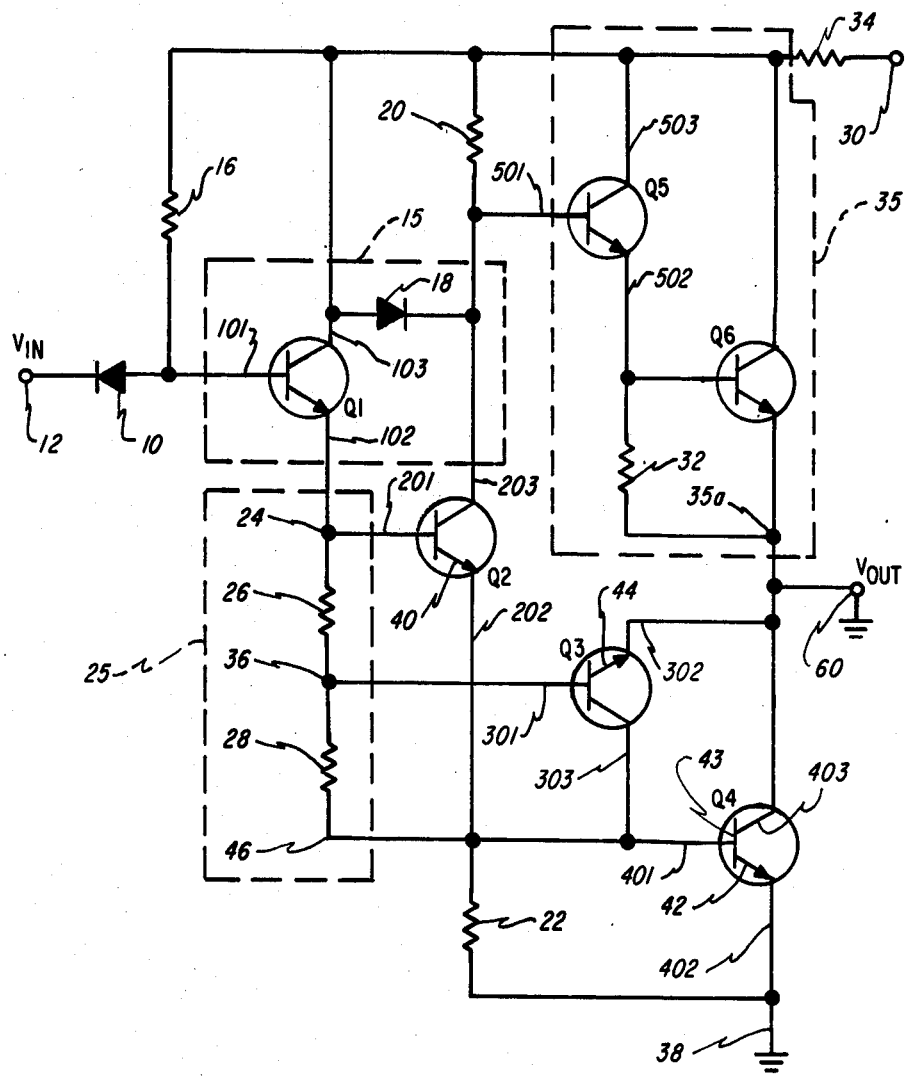

The FIGURE shows a TTL circuit comprising an antisaturation circuit embodying the present invention. With reference to the Figure, at least one diode 10 forms the input to the circuit, the cathodes of the diodes being connected to at least one input terminal 12. The anodes of the input diodes are connected to a voltage supply 30 of, for example, approximately 5 v by way of current limiting resistors 16 and 34 as well as to the base 101 of a clamping transistor $Q_1$. The clamping transistor or Baker Clamp 15 serving to prevent the phase splitter transistor $Q_2$ from saturating when the TTL circuit is in its ON state, eg. when the output voltage at the output terminal 60 is at a TTL low logic level. The collector 103 of the clamping transistor $Q_1$ is directly conected to the power supply 30 through the current limiting resistor 34. The emitter 102 of $Q_1$ is connected to both the base 201 of the phase-splitter transistor $Q_2$ and to the upper node 24 of a resistance divider network 25 which includes resistors 26 and 28. The base 101 of the clamping transistor $Q_1$ in combination with the diode 18 form the Baker Clamp 15 which shunts the collector-base junction of the phase-splitter transistor $Q_2$. Although a Baker Clamp is shown here, other methods of providing a $V_{BE}$ drop and preventing the phase splitter from saturating may be used and are intended to be within the scope of the present invention.

The collector 203 of the phase-splitter transistor $Q_2$ is connected to the cathode of the Baker Clamp diode 18 as well as to the base 501 of the upper Darlington pull-up transistor $Q_5$ and to the power supply 30 through resistors 20 and 34. The emitter 202 of the phase-splitter transistor $Q_2$ is coupled to the base 401 of the output transistor $Q_4$, the collector 303 of the antisaturation transistor $Q_3$, the lower node 46 of the divider network 25, and to the ground potential contact 38 through a discharge resistor 22.

The base 201 of the phase-splitter transistor $Q_2$ is connected to the emitter 102 of the Baker Clamp transistor $Q_1$, and to the upper node 24 of the resistance divider network 25.

The resistance divider network comprising the two resistors, 26 and 28, is coupled across the base-emitter junction 40 of transistor $Q_2$, with the upper node 24 of the divider 25 connected to the base 201 of the phase splitter $Q_2$ and to the emitter 102 of the Baker Clamp transistor $Q_1$. The central node 36 of the divider network 25 is connected directly to the base 301 of the antisaturation transistor $Q_3$.

The lower node 46 of the divider network 25 is coupled to the base 401 of the output transistor $Q_4$ which allows for the low level output voltage, $V_{OL}$, to be adjusted by simply varying the ratio of resistance values in the resistor divider network 25. The lower node 46 is also connected to the collector 303 of the antisaturation transistor $Q_3$, the emitter 202 of the phase splitter $Q_2$ and the ground potential contact 38 by way of the discharge resistor 22. The divider network resistances 26, 28 should be chosen large enough so that the divider 25 will not pull the current down such that it would prevent the phase-splitter transistor from turning ON when the output voltage is at a low logic level.

The antisaturation transistor $Q_3$ is coupled across the collector-base junction 43 of the output transistor $Q_4$, with the emitter 302 of $Q_3$ connected to the output terminal 60, the node 35a at the lower portion of an active pull up stage 35, and the collector 403 of the output transistor $Q_4$.

The collector 303 of the antisaturation transistor $Q_3$ is connected to ground potential contact 38 by way of the discharge resistor 22 and to the base 401 of the output transistor $Q_4$ as well as to the lower node 46 ofthe divider network 25 and to the emitter 202 of the phase splitter $Q_2$. The output transistor $Q_4$ has its collector 403 connected to the output terminal 60 of the TTL circuit and its emitter 402 connected directly to ground potential contact 38, so that the output voltage at terminal 60 is the output transistor's $Q_4$ collector-emitter voltage. The output terminal 60 is situated between the output transistor $Q_4$ and the pull up stage 35 comprising transistors $Q_5$ and $Q_6$ and resistor 32.

When the input potential provided to input terminal 12 is at the low TTL state of less than 0.8 v, the input diodes 10 are forward biased, thereby providing a current path through the resistor 16. The Baker Clamp transistor $Q_1$ is biased OFF which in turn prevents the phase splitter transistor $Q_2$ and the output transistor $Q_4$ from turning ON, thus producing a high output voltage level at the output terminal 60. The active pull up stage 35 will be ON, having already provided a low impedance path for charging up any output load capacitance. The Darlington pull up stage 35 shown in the FIGURE is but one example of several different active pull up stages which may be utilized for providing a low impedance path. Use of an active pull up stage is generally included however, in high speed TTL applications because of its capacity to bring the output voltage to its high level state rapidly when the circuit's input is changed to its low level state.

Referring again to the Figure whenever the input potential supplied to the circuit's input terminal is at least 0.8 v (with the typical input being 1.4 v) the input is at its high state and the input diodes 10 are back biased so that the current flowing through resistor 16 will then flow to the base 101 of the clamping transistor $Q_1$. The Baker Clamp transistor $Q_1$ will then be turned ON allowing for the phase splitter transistor $Q_2$ and output transistor $Q_4$ as well as the antisaturation transistor $Q_3$ to be ON. The Baker Clamp 15 comprising the clamping transistor $Q_1$ and diode 18 is coupled across the collector-base junction of the phase splitter $Q_2$ so that the base emitter junction of the clamping transistor $Q_1$ and the P-N junction of the diode have the effect of back to back diodes thereby producing a zero potential across the collector-base junction of the phase splitter. This prevents the collector-base junction of phase splitter $Q_2$ from forward biasing and thus saturating.

The emitter of transistor $Q_1$ provides base current to the phase splitter $Q_2$ while the base emitter voltage $V_{BE}$ of the phase splitter $Q_2$ provides an internal reference voltage. The resistances of the resistors 26, 28 of divider network 25 may be approximately of equal value so that one half of a base emitter voltage is produced across each of the resistors 26, 28 of the divider network 25. This produces an approximate reference voltage of one and one half $V_{BE}$ at the base 301 of the antisaturation transistor $Q_3$ and a low level output voltage of approximately one half $V_{BE}$. Because base-emitter voltage of a transistor generally increases as the temperature decreases, the choosing of the ratio of resistance values in the divider network is important so that the $V_{OL}$ will still meet TTL output levels. By biasing the base 301 of the antisaturation transistor $Q_3$ at one and a half $V_{BE}$, $Q_3$ will turn on when the output of the circuit at 60 is less than half of $V_{BE}$, causing the base drive current of the output transistor $Q_4$ to flow through the collector 303 and emitter 302 path of antisaturation transistor $Q_3$ thereby shunting the base current of output transistor $Q_4$. This circuit provides a TTL low output voltage level even when $V_{BE}$ increases at low temperatures, while also clamping the output transistor out of saturation at high temperatures. The ratio of resistances in resistor 26, 28 in the divider network may be varied to accommodate different $V_{OL}$ output requirements.

The active pull-up phase 35 is biased off in this state of the circuit with the resistor 32 providing a shunt across the base emitter junction of the lower Darlington transistor $Q_6$ such that any leakage current flowing through the upper Darlington $Q_5$ will not turn on $Q_6$.

The discharge resistor 22 provides a path for any parasitic charge build-up which may occur in the output transistor $Q_4$ so that output transistor $Q_4$ will be able to turn off quickly.

While the invention has been described with respect to its preferred embodiment, it is understood that various changes in form and detail may be made without departing from the spirit and scope of the invention.

What is claimed is:

1. In a TTL circuit having an input means including an input terminal and an input transistor, and an output means including an antisaturation transistor having a control input means and an output transistor, said antisaturation transistor being coupled across a junction of said output transistor, the improvement comprising:
   a voltage control means connected to said control input means of said antisaturation transistor for providing an adjustable reference potential to said antisaturation transistor, wherein said voltage control means includes a resistive bridge coupled across a base emitter junction of said input transistor and said reference potential is derived from said base emitter voltage of said input transistor.

2. In a TTL logic circuit of the type including an output transistor and an antisaturation transistor coupled across a collector base junction of said output transistor, said output transistor being protected by said antisaturation transistor which antisaturation transistor is controlled by an internal reference voltage, said voltage being taken from a resistive divider network to which is supplied a base emitter voltage of a transistor.

3. In a TTL circuit having an output transistor and an antisaturation transistor connected to a base and collector of said output transistor, the improvement comprising:
   providing, as an input to a base of said antisaturation transistor, a reference potential varying in response to variations in the base emitter voltage of a transistor.

4. In a TTL gate, the improvement comprising:
   biasing means for biasing an antisaturation clamping circuit such that a collector-base of a driven output transistor is coupled with a collector-emitter of an antisaturation transistor to prevent saturation of the output transistor over a wide temperature range, said biasing means comprising a phase splitter transistor having a current source and an input gate coupled to a base of said phase splitter transistor and a resistive bridge coupled across said phase splitter's base emitter junction, a collector of said phase splitter transistor being connected to a potential supply via a resistively coupled means, an emitter of said phase splitter transistor being connected to the base of said driven output transistor; said biasing means supplying a drive current to a base of said driven output transistor, while providing a biasing voltage for said antisaturation transistor which is insensitive to changes in current, resistance values, said potential supply, and current gain wherein said resistive bridge includes a center node connected to a base of the antisaturation transistor, the ratio of resistance values of the bridge being chosen for biasing the antisaturation transistor such that a clamping voltage of approximately one and a half times a base emitter voltage of the phase splitter transistor is provided.

* * * * *